(12) United States Patent
Shim et al.

(10) Patent No.: US 7,324,398 B2
(45) Date of Patent: Jan. 29, 2008

(54) MEMORY DEVICES CONFIGURED TO DETECT FAILURE OF TEMPERATURE SENSORS THEREOF AND METHODS OF OPERATING AND TESTING SAME

(75) Inventors: Jae-Eung Shim, Seoul (KR); Jung-Yong Choi, Gyeonggi-do (KR); Young-Gu Kang, Gyeonggi-do (KR); Min-Gyu Hwang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/236,372

(22) Filed: Sep. 27, 2005

(65) Prior Publication Data
US 2006/0077742 A1    Apr. 13, 2006

(30) Foreign Application Priority Data
Oct. 11, 2004    (KR) ...................... 10-2004-0080809

(51) Int. Cl.
*G11C 7/04* (2006.01)
(52) U.S. Cl. .................... 365/212; 365/211; 714/42
(58) Field of Classification Search ................ 365/212, 365/211, 230.06, 230.07, 149, 185.23; 714/42
See application file for complete search history.

(56) References Cited

U.S. PATENT DOCUMENTS

| 6,353,623 B1* | 3/2002 | Munks et al. ................. 372/20 |
|---|---|---|
| 6,667,925 B2* | 12/2003 | Kobayashi et al. ......... 365/211 |
| 6,684,154 B2* | 1/2004 | Isobe et al. ................. 701/114 |
| 6,944,562 B2* | 9/2005 | Lee et al. ..................... 702/99 |
| 2003/0039127 A1* | 2/2003 | Duduman et al. ............ 363/16 |
| 2003/0135794 A1* | 7/2003 | Longwell et al. ............. 714/42 |
| 2003/0218931 A1 | 11/2003 | Okamoto et al. |
| 2004/0208225 A1* | 10/2004 | Otsuka ....................... 374/172 |
| 2005/0216220 A1* | 9/2005 | Kim .......................... 702/130 |

FOREIGN PATENT DOCUMENTS

| KR | 2003-0035767 | 3/2002 |
|---|---|---|
| KR | 2002-0091657 | 12/2002 |

* cited by examiner

*Primary Examiner*—Connie C. Yoha
(74) *Attorney, Agent, or Firm*—Myers Bigel Sibley & Sajovec PA

(57) ABSTRACT

A memory device includes a temperature sensor configured to generate a temperature detection signal responsive to a temperature of the memory device and a self-refresh control circuit configured to control a refresh of the memory device responsive to the temperature detection signal. The device further includes a temperature-detection-error sensing circuit configured to assert a temperature-detection-error signal responsive to an error in the temperature detection signal. The temperature-detection-error sensing circuit may be configured to provide the asserted temperature-detection-error signal at a temperature-detection-error sensing pad configured to be coupled to an external device and/or the device may further include a temperature sensor control circuit configured to control the temperature detection signal responsive to the temperature-detection-error signal. Related operating and testing methods may be provided.

23 Claims, 5 Drawing Sheets

| TEMPERATURE | ST45 | ST75 | SELF REFRESH PERIOD |
|---|---|---|---|
| BELOW 45°C | L | L | X3 |
| 45°C~75°C | H | L | X1 |
| ABOVE 75°C | H | H | X0.5 |
| - | L | H | X1 (ERROR) |

MEMORY DEVICES CONFIGURED TO DETECT FAILURE OF TEMPERATURE SENSORS THEREOF AND METHODS OF OPERATING AND TESTING SAME

CROSS-REFERENCE TO RELATED APPLICATION

This application claims the benefit of Korean Patent Application No. 2004-80809 filed on Oct. 11, 2004, the contents of which are herein incorporated by reference in its entirety.

BACKGROUND OF THE INVENTION

The present invention generally relates to memory devices and methods of operation and testing thereof, and more particularly, to memory devices having temperature sensors used, for example, in temperature compensated self-refresh operations.

Typically, a memory cell of Dynamic Random Access Memory (DRAM) includes one cell transistor and one cell capacitor. In such as DRAM cell, data is written by charging the cell capacitor. However, leakage current may remove the charge stored in the cell capacitor over time, even without read/write operations being performed. For this reason, a refresh operation is typically required. In a typical recharge operation, data is read from the cell capacitor and then rewritten thereto.

A time interval for the refresh operation is referred to as a refresh period ($t_{REFmax}$). As DRAM capacity increases, the refresh period also typically increases. To prevent data from disappearing due to the length of the refresh period, various attempts have been made to reduce leakage current from cell capacitors. In addition, increasing the refresh period can allow the semiconductor memory device to dissipate less current.

In the case of a mobile device, even when all internal circuits except for a semiconductor memory device are in a turned-off state, a self-refresh current flows through the semiconductor memory device so as to perform a self-refresh operation at every refresh period. Some semiconductor memory devices use a temperature sensor to detect an internal chip temperature, and change the self-refresh period depending on the detected temperature. In this manner, the self-refresh period may be extended. This technique is referred to as a Temperature Compensated Self Refresh (TCSR).

Because the leakage current of a cell capacitor typically is strongly dependent on temperature, the leakage current typically increases rapidly as temperature rises. Conversely, leakage current typically decreases as temperature drops. Using the above-described characteristic, current dissipation may be reduced by maintaining a long refresh period when the temperature sensor detects a low temperature.

A typical conventional temperature sensor used in a semiconductor memory device may include a diode stage and a resistor stage coupled in parallel with the diode stage. Temperature characteristics of the currents flowing through the diode stage and the resistor stage are opposite to each other. Using the opposite temperature characteristics, the temperature sensor detects a predefined temperature by adjusting the resistance such that the currents flowing through the diode stage and the resistor stage are matched.

If the predefined temperature is detected, the temperature sensor outputs a corresponding signal. Because the temperature characteristics of the currents flowing through the diode stage and the resistor stage are used, the temperature sensor may be sensitive to variation of the current characteristics of the resistor stage and the diode stage due to process parameter variation. Therefore, the temperature sensor may operate erroneously. To prevent erroneous operation, the temperature detection characteristics may need to be corrected.

FIG. 1 is a block diagram of a conventional temperature-sensor correcting circuit of a semiconductor memory device. A temperature sensor enabling mode register set (MRS) command TSEMRS is applied to enable a temperature sensor 101. The temperature sensor 101 also receives a temperature compensated self refresh circuit driving voltage VTCSR.

If the temperature sensor 101 is enabled by the temperature sensor enabling MRS command TSEMRS, a correction is performed while the temperature of the semiconductor memory device is increased in a controlled fashion. The number of resistors of the resistor stage used in the temperature sensor 101 is adjusted depending on the temperature of the semiconductor memory device, thereby detecting the predetermined temperature. Then, a correction for process parameters is performed by fuse trimming so as to match with the determined resistance.

The temperature sensor 101 outputs two temperature detection signals ST45 and ST75. The first temperature detection signal ST45 is asserted when the temperature is greater than 45° C., while the second temperature detection signal ST75 is asserted when the temperature is greater than 75° C.

The first and second temperature detection signals ST45 and ST75 output from the temperature sensor 101 can be checked via first and second temperature detection pads PADST45 and PADST75, respectively. While checking the output signals of the temperature sensor 101 through the temperature detection pads PADST45 and PADST75, the temperature sensor 101 may be corrected by fuse trimming, which may be accomplished by applying a trimming address TRIMADDR to the temperature sensor 101. The trimming address TRIMADDR is a signal that is applied for performing the fuse trimming according to the measured characteristics of the temperature sensor 101.

In a real self refresh mode, the first and second temperature detection signals ST45 and ST75 output from the temperature sensor 101 are input to a self refresh period control circuit 102. The self-refresh period control circuit 102 controls a self-refresh period of the semiconductor memory device according to the first and second temperature detection signals ST45 and ST75.

In a conventional correction technique, correction is performed after the temperature sensor enabling MRS command TSEMRS is applied to operate the semiconductor memory device in the MRS mode. Therefore, the operating characteristics of the temperature sensor 101 in the self-refresh mode may not be reflected completely in the correction method. In particular, the operating conditions of the temperature sensor 101 may change due to a difference between the MRS mode and the self-refresh mode. This difference may result in a skew between a trip temperature of the temperature sensor 101 in the fuse trimming mode and a trip temperature of the temperature sensor 101 in the real self-refresh mode. Consequently, the performance of the semiconductor memory device may be degraded.

Accordingly, in order to reduce the difference in the operating characteristics of the temperature sensor due to the different operating modes, the semiconductor memory device may further include a circuit capable of performing the trimming operation of the temperature sensor in an environment similar to real operating conditions. That is, the temperature sensor of the semiconductor memory device may be corrected in an environment similar to that of the real self-refresh mode.

However, a failure mode may arise wherein the first and second temperature detection signals ST45 and ST75 are reversed. As described above, the first and second temperature detection signals ST45 and ST75 may be asserted at temperatures above 45° C. and above 75° C., respectively. If the temperature sensor fails, the second temperature detection signal ST75 may be asserted even when the first temperature detection signal ST45 is in a de-asserted state. Such a reversal phenomenon may be caused by variation of manufacturing process conditions.

Accordingly, a semiconductor memory device in which the reversal phenomenon of the temperature detection signals happens may not be capable of correction, which may cause problems in current characteristics of the semiconductor memory device. As a result, there is a need for circuits and methods that can detect a defective semiconductor memory device and/or interrupt the TCSR function of a defective semiconductor memory device in the presence of such a defect.

SUMMARY OF THE INVENTION

In some embodiments of the present invention, a memory device includes a temperature sensor configured to generate a temperature detection signal responsive to a temperature of the memory device and a self-refresh control circuit configured to control a refresh of the memory device responsive to the temperature detection signal. The device further includes a temperature-detection-error sensing circuit configured to assert a temperature-detection-error signal responsive to an error in the temperature detection signal. The temperature-detection-error sensing circuit may be configured to provide the asserted temperature-detection-error signal at a temperature-detection-error sensing pad configured to be coupled to an external device and/or the device may further include a temperature sensor control circuit configured to control the temperature detection signal responsive to the temperature-detection-error signal.

In further embodiments, the temperature sensor may be configured to assert a first temperature detection signal responsive to the temperature of the memory device exceeding a first temperature and to assert a second temperature detection signal responsive to the temperature of the memory device exceeding a second temperature greater than the first temperature, and the temperature-detection-error sensing circuit may be configured to generate the temperature-detection-error signal responsive to the first and second temperature detection signals. The temperature-detection-error sensing circuit may be configured to assert the temperature-detection-error signal responsive to a combination of the first and second temperature detection signals corresponding to erroneous operation of the temperature sensor. For example, the temperature-detection-error sensing circuit may be configured to assert the temperature-detection-error signal responsive to a reversal phenomenon of the first and second temperature detection signals.

In further embodiments of the present invention, the memory device includes a temperature sensor control circuit configured to control the temperature detection signal responsive to the temperature-detection-error signal. For example, the temperature sensor control circuit may be configured to fix the temperature detection signal responsive to assertion of the temperature-detection-error signal.

In some embodiments, the temperature sensor control circuit may include a switching element configured to interrupt the temperature detection signal responsive to assertion of the temperature-detection-error signal. The temperature sensor control circuit may comprise a latch configured to latch an input to a control electrode of the switching element responsive to assertion of the temperature-detection-error signal.

Some embodiments of the present invention may provide methods of operating a memory device. A temperature detection signal is generated responsive to a temperature of the memory device and a refresh of the memory device is controlled responsive to the temperature detection signal. A temperature-detection-error signal is asserted responsive to an error of the temperature detection signal. The asserted temperature-detection-error signal may be provided to a recipient external to the memory device and/or the temperature detection signal may be controlled responsive to the temperature-detection-error signal.

In additional embodiments of the present invention, methods of testing a temperature sensor used to control refresh of a memory device may be provided. A temperature of the semiconductor memory device is changed to a predetermined temperature. A temperature detection signal is generated responsive to the predetermined temperature. A temperature-detection-error signal is asserted responsive to an error of the temperature detection signal. The temperature-detection-error signal is provided to an external recipient via a temperature-detection-error sensing pad of the memory device and the memory device is identified as defective responsive to the temperature-detection-error signal at the temperature-detection-error sensing pad.

Further embodiments of the present invention may provide additional methods of testing a temperature sensor used to control refresh in a memory device. A temperature of the memory device is changed to a predetermined temperature. A temperature detection signal is generated responsive to the predetermined temperature. A temperature-detection-error signal is asserted responsive to an error of the temperature detection signal. The temperature detection signal is controlled responsive to the temperature-detection-error signal. The memory device is identified as defective responsive to the temperature detection signal.

BRIEF DESCRIPTION OF THE DRAWINGS

The above and other advantages of the present invention will become more apparent by describing in detail the example embodiments thereof with reference to the accompanying drawings, in which.

DESCRIPTION OF EMBODIMENTS OF THE INVENTION

Figures 1, 2:
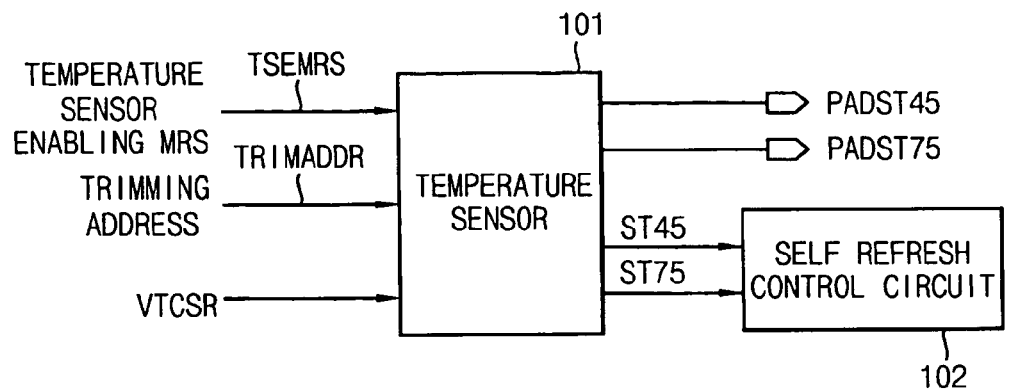
FIG. 1 is a block diagram of a conventional temperature-sensor correcting circuit of a semiconductor memory device.
FIG. 2 is a diagram illustrating a relationship between a temperature characteristic of a temperature sensor and a self-refresh period of a semiconductor memory device.

Specific exemplary embodiments of the invention now will be described with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements. It will be understood that when an element is referred to as being "connected" or "coupled" to another element, it can be directly connected or coupled to the other element or intervening elements may be present. Furthermore, "connected" or "coupled" as used herein may include wirelessly connected or coupled.

The terminology used herein is for the purpose of describing particular embodiments only and is not intended to be limiting of the invention. As used herein, the singular forms "a", "an" and "the" are intended to include the plural forms as well, unless expressly stated otherwise. It will be further understood that the terms "includes," "includes," "including" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present specification and will not be interpreted in an idealized or overly formal sense unless expressly so defined herein.

It will be understood that although the terms first and second are used herein to describe various elements, these elements should not be limited by these terms. These terms are only used to distinguish one element from another element. Thus, a first item could be termed a second item, and similarly, a second item may be termed a first item without departing from the teachings of the present invention. As used herein, the term "and/or" includes any and all combinations of one or more of the associated listed items. The symbol "/" may also used as a shorthand notation for "and/or".

FIG. 2 is a diagram illustrating a relationship between a temperature characteristic of a temperature sensor and a self-refresh period of a semiconductor memory device. As discussed above with reference to FIG. 1, a temperature sensor 101 used for a temperature compensated self refresh (TCSR) of a semiconductor memory device may output first and second temperature detection signals ST45 and ST75. The first temperature detection signal ST45 may be asserted at a temperature above about 45°, whereas the second temperature detection signal ST75 may be asserted at a temperature above about 75° C.

At a temperature below about 45° C., both of the first and second temperature detection signals ST45 and ST75 are deasserted (211). In this case, the self-refresh period may have a longest period X3 according to temperature characteristics of the leakage current of the cell capacitor. At a temperature between 45° C. and 75° C., the first temperature detection signal ST45 is asserted, while the second temperature detection signal ST75 is deasserted (221). In this case, the self-refresh period has a medium period X1. At a temperature above 75° C., both of the first and second temperature detection signals ST45 and ST75 are asserted (231). In this case, the self-refresh period has a shortest period X0.5 according to temperature characteristics of the leakage current of the cell capacitor.

However, the first and second temperature detection signals ST45 and ST75 may be reversed due to a failure of the temperature sensor. That is, regardless of the temperature, the first temperature detection signal ST45 may be deasserted and the second temperature detection signal ST75 asserted. Some embodiments of the present invention may provide a semiconductor memory device and methods capable of detecting such a failure of the temperature sensor.

Figure 3:
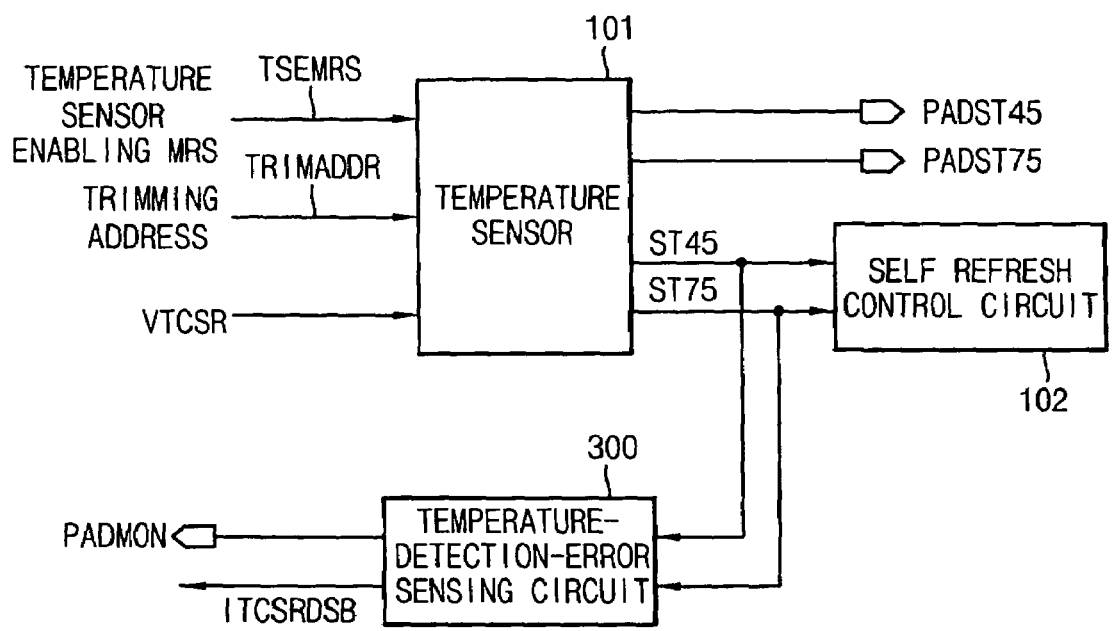
FIG. 3 is a block diagram of a temperature-sensor correcting circuit of a semiconductor memory device according to some embodiments of the present invention.

FIG. 3 is a block diagram of a temperature-sensor correcting circuit 300 of a semiconductor memory device according to some embodiments of the present invention. Referring to FIG. 3, the temperature-detection-error sensing circuit 300 is coupled to a temperature-sensor correcting circuit as illustrated in FIG. 1. A temperature sensor 101 begins to operate when a temperature-sensor enabling MRS command TSEMRS is applied thereto. The temperature sensor 101 receives a TCSR circuit driving voltage VTCSR. When the temperature sensor 101 is enabled by the temperature-sensor enabling MRS command TSEMRS, correction for variation in process parameters is achieved by fuse trimming while applying increasing temperature to the semiconductor memory device.

The first and second temperature detection signals ST45 and ST75 output from the temperature sensor 101 can be checked from outside the device through first and second temperature detection pads PADST45 and PADST75, respectively. While checking the first and second temperature detection signals ST45 and ST75, the temperature sensor 101 may be corrected by applying a trimming address TRIMADDR to the temperature sensor 101, as described above with reference to FIG. 1.

As illustrated in FIG. 2, a failure may cause the second temperature detection signal ST75 to be asserted while the first temperature detection signal ST45 is deasserted. The temperature-detection-error sensing circuit 300 can be configured with a combination of logic gates for receiving the first and second temperature detection signals ST45 and ST75 and detecting the signal combination 241 associated with the reversal phenomenon.

Figure 4:
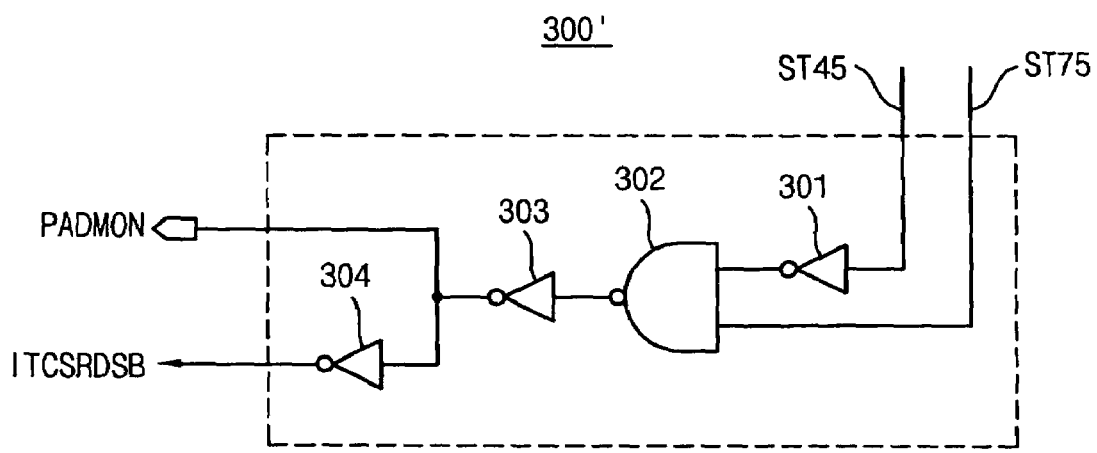
FIG. 4 is a circuit diagram of a temperature-detection-error sensing circuit according to further embodiments of the present invention.

FIG. 4 is a circuit diagram of the temperature-detection-error sensing circuit 300' that may be used in the circuit of FIG. 3 according to further embodiments of the present invention. The temperature-detection-error sensing circuit 300' includes a combination of logic gates for performing logic operations on the first and second temperature detection signals ST45 and ST75 output from the temperature sensor 101. An inverter 301 inverts the first temperature detection signal ST45, and a NAND gate 302 receives the inverted first temperature detection signal and the second temperature detection signal ST75. An inverter 303 inverts an output signal of the NAND gate 302 to output a temperature-detection-error signal. The temperature-detection-error signal output from the inverter 303 is asserted when the reversal phenomenon 241 occurs, that is, when the first temperature detection signal ST45 is deasserted while the second temperature detection signal ST75 is asserted.

The temperature-detection-error signal may be output through a temperature-detection-error sensing pad PAD-MON. Further, the temperature-detection-error signal may also be inverted by an inverter 304 and output as a temperature sensor control signal ITCSRDSB, which may be input to a temperature sensor control circuit, such as the circuit 500 shown in FIG. 5. When there is sufficient design margin to provide an additional pad to the semiconductor memory device, it is possible to configure the semiconductor memory device using the temperature-detection-error sensing pad PADMON. However, when there is insufficient design margin to provide such a pad, it is possible to configure the semiconductor memory device to include a temperature sensor control circuit, such as the circuit 500 of FIG. 5, and eliminate the external pad.

The temperature sensor control circuit 500 receives the temperature sensor control signal ITCSRDSB from the temperature-detection-error sensing circuit 300. The temperature sensor control signal ITCSRDSB passes through inverters 501 and 502 and a transmission gate 504. The temperature sensor control signal ITCSRDSB is latched by a latch 506.

An enabling signal VCCHB for enabling the temperature sensor control circuit 500 controls the temperature sensor control circuit 500 by selectively connecting a power supply voltage VDD to the input signal of the latch 506. When the temperature sensor control signal ITCSRDSB is asserted and the enable signal VCCHB is asserted (e.g., is "low"), the latch 506 latches the temperature sensor control signal ITCSRDSB.

An inverter 507 inverts the latched temperature sensor control signal from the latch 506 and provides the inverted signal to switching elements 508 and 509. The switching elements 508 and 509 interrupt the first and second temperature detection signals ST45 and ST75 output from the temperature sensor 101 if the temperature sensor control signal ITCSRDSB indicated a temperature sensor failure. In the illustrated embodiments, each of the switching elements 508 and 509 includes a N-type transistor and interrupts the output of the temperature detection signals in response to the temperature sensor control signal ITCSRDSB.

Figure 6:
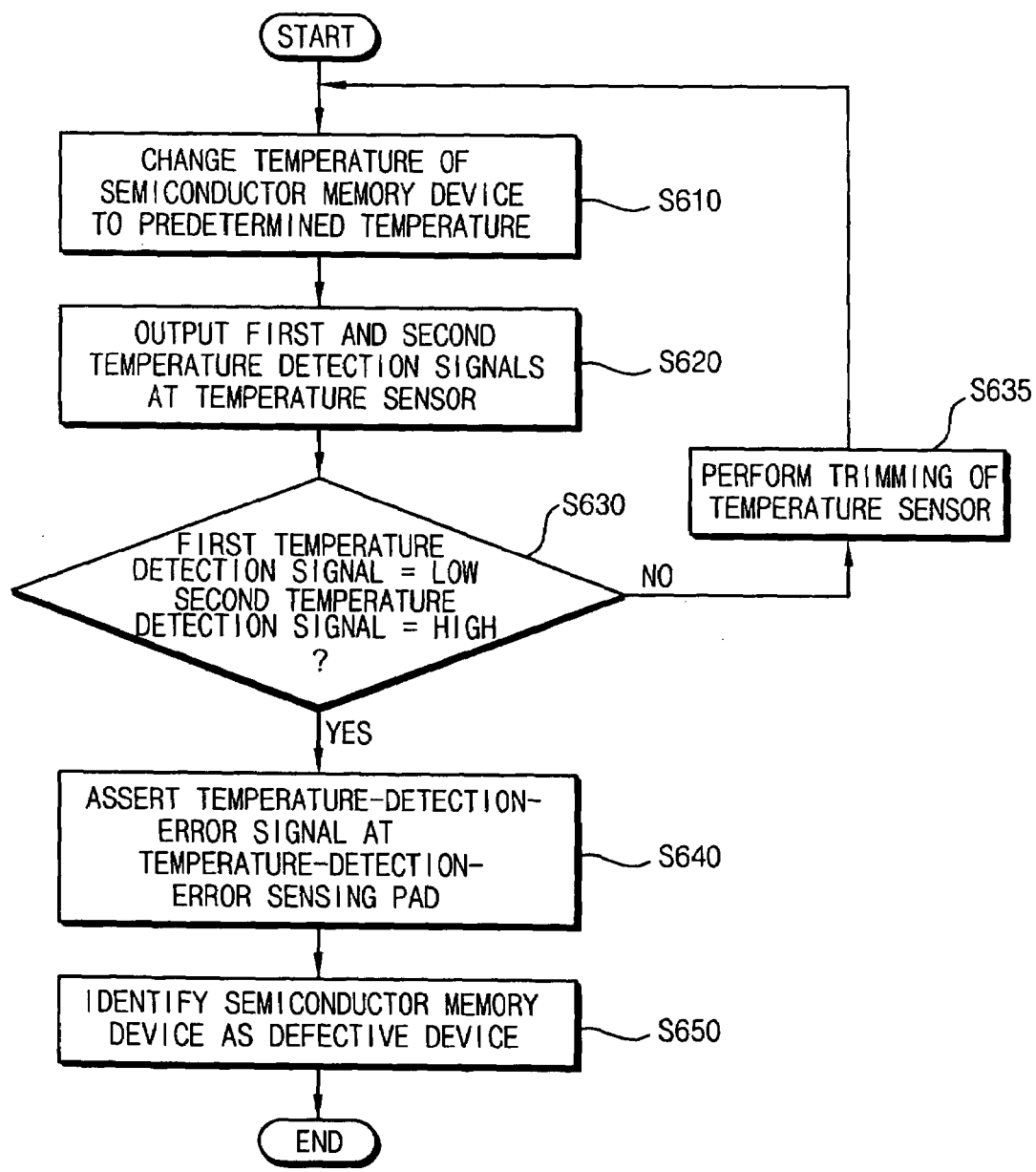
FIG. 6 is a flowchart illustrating operations for testing a semiconductor memory device according to further embodiments of the present invention.

FIG. 6 is a flowchart illustrating operations for testing a defective semiconductor memory device according to some embodiments of the present invention. In step S610, temperature of the semiconductor memory device is increased to a predetermined temperature for trimming the temperature sensor of the semiconductor memory device. In step S620, the temperature sensor of the semiconductor memory device outputs the temperature detection signals corresponding to the predetermined temperature. The temperature detection signals may be the first and second temperature detection signals ST45 and ST75 shown in FIG. 3. In step S630, the first and second temperature detection signals ST45 and ST75 are input to the temperature-detection-error sensing circuit 300, and the temperature-detection-error sensing circuit 300 detects whether or not the reversal phenomenon of the temperature detection signal is present. In step S635, if the reversal phenomenon is not present, the trimming of the temperature sensor is performed. The steps S610-630 are repeated.

If a reversal phenomenon of the temperature detection signals is present, the temperature-detection-error sensing circuit 300 asserts a temperature-detection-error signal at the temperature-detection-error sensing pad PADMON at step S640. In step S650, an external test apparatus detects a failure of the temperature sensor of the target semiconductor memory device through the temperature-detection-error sensing pad PADMON and identifies the target semiconductor memory device as a defective product.

In this test procedure, an external test apparatus is connected to the temperature-detection-error sensing pad PADMON and detects the failure of the temperature sensor of the semiconductor memory device. When such a pad is not available, another test method using the temperature sensor control circuit 500 can be used.

Figure 5:
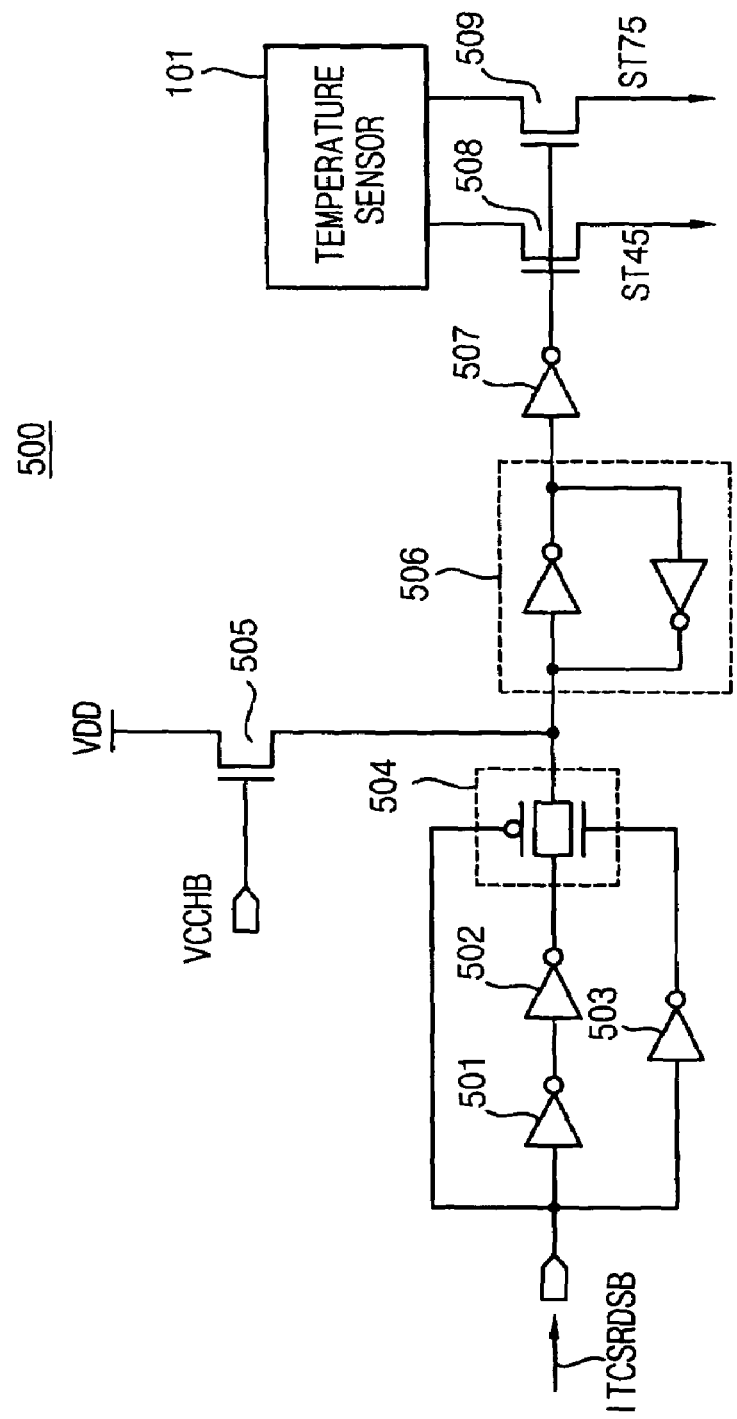
FIG. 5 is a circuit diagram of a temperature sensor control circuit according to additional embodiments of the present invention.

When the output of the temperature sensor is disabled by a temperature sensor control circuit, such as the circuit 500 of FIG. 5, the self-refresh period control circuit 102 does not operate normally. In particular, the self-refresh period of the semiconductor memory device will not substantially change with temperature, and the self-refresh current may also not change with temperature. The external test apparatus may detect a lack of change in the self-refresh current, and may responsively identify the semiconductor memory device as defective.

Figure 7:
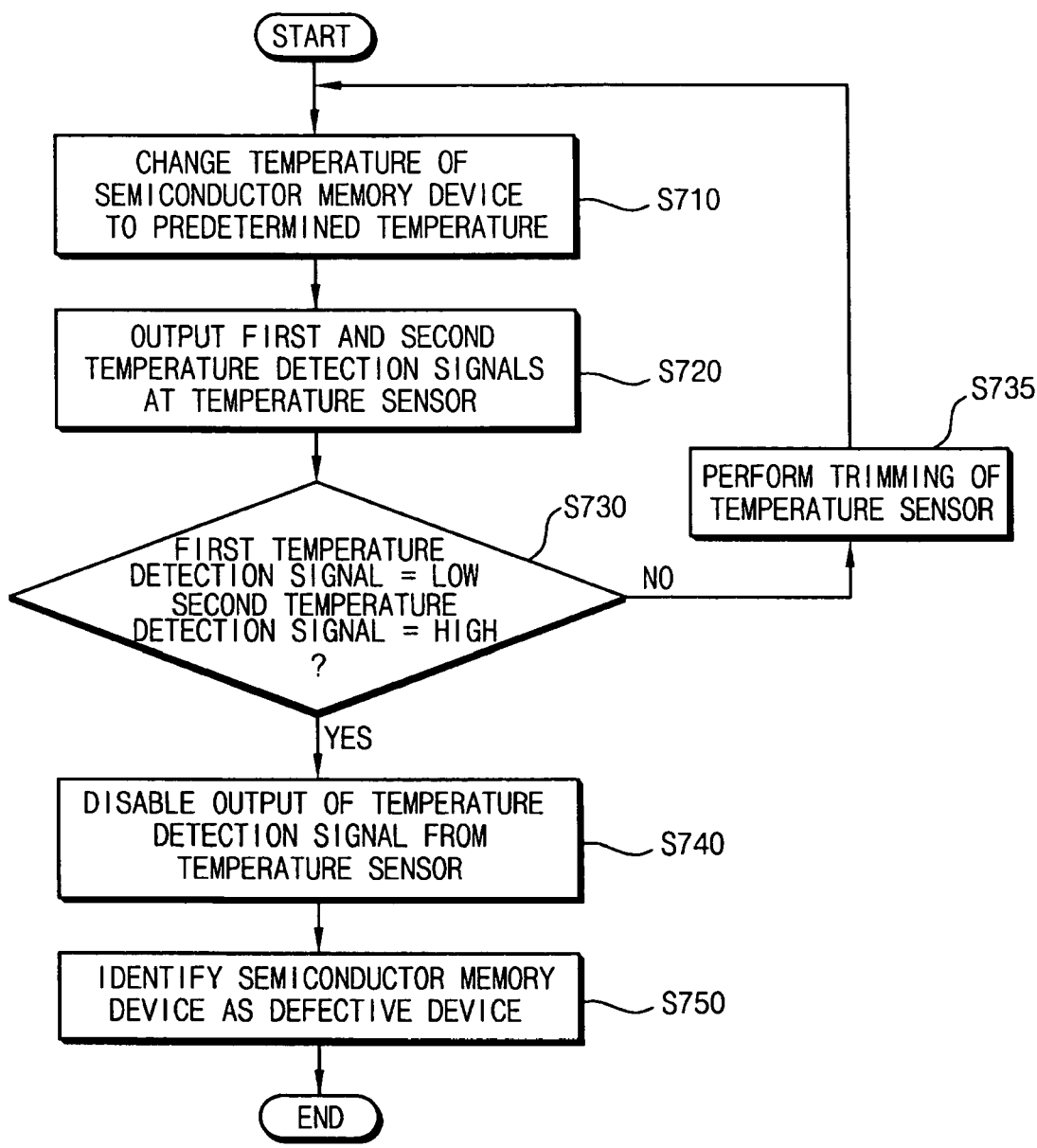
FIG. 7 is a flowchart illustrating operations for testing a semiconductor memory device according to additional embodiments of the present invention.

FIG. 7 is a flowchart illustrating operations for testing a semiconductor memory device according to further embodiments of the present invention. Referring to FIG. 7, in step S710, the temperature of the semiconductor memory device is increased to a predetermined temperature for trimming the temperature sensor of the semiconductor memory device. In step S720, the temperature sensor of the semiconductor memory device outputs the first and second temperature detection signals ST45 and ST75 corresponding to the predetermined temperature. In step S730, the first and second temperature detection signals ST45 and ST75 are input to the temperature-detection-error sensing circuit 300, and the temperature-detection-error sensing circuit 300 detects whether the reversal phenomenon of the temperature detection signals is present. In step S735, if the reversal phenomenon is not present, the trimming of the temperature sensor is performed. The steps S710-730 are repeated, as described in FIG. 6.

If the reversal phenomenon of the temperature detection signals is detected, the output of the temperature detection signals from the temperature sensor is interrupted at step S740. When the temperature detection signals are interrupted, the self-refresh period control circuit 102 does not change the self-refresh period. An external test apparatus may detect that there is no change in the refresh period, e.g., by detecting substantially no change in refresh current, and may identify the semiconductor memory device as defective at step S750.

According to various embodiments of the present invention, there are provided semiconductor memory devices capable of detecting the failure of a temperature sensor used in a temperature compensated self-refresh semiconductor memory device, along with related operating and test methods.

It will be apparent to those skilled in the art that various modifications and variations can be made in the present invention. Thus, it is intended that the present invention covers the modifications and variations of this invention provided they come within the scope of the appended claims and their equivalents.

What is claimed:

1. A memory device comprising:
    a temperature sensor configured to generate a temperature detection signal responsive to a temperature of the memory device;

a self-refresh control circuit configured to control a refresh of the memory device responsive to the temperature detection signal; and a temperature-detection-error sensing circuit configured to assert a temperature-detection-error signal responsive to an error in the temperature detection signal, wherein the temperature sensor is configured to assert a first temperature detection signal responsive to the temperature of the memory device exceeding a first temperature and to assert a second temperature detection signal responsive to the temperature of the memory device exceeding a second temperature greater than the first temperature, and wherein the temperature-detection-error sensing circuit is configured to generate the temperature-detection-error signal responsive to the first and second temperature detection signals.

2. The memory device of claim 1, wherein the temperature-detection-error sensing circuit is configured to provide the asserted temperature-detection-error signal at a temperature-detection-error sensing pad configured to be coupled to an external device.

3. The memory device of claim 1, wherein temperature-detection-error sensing circuit is configured to assert the temperature-detection-error signal responsive to a reversal phenomenon of the first and second temperature detection signals.

4. The memory device of claim 1, wherein the temperature-detection-error sensing circuit is configured to assert the temperature-detection-error signal responsive to a combination of the first and second temperature detection signals corresponding to erroneous operation of the temperature sensor.

5. The memory device of claim 1, further comprising a temperature sensor control circuit configured to electronically control the temperature detection signal responsive to the temperature-detection-error signal.

6. The memory device of claim 5, wherein the temperature sensor control circuit is configured to interrupt the temperature detection signal responsive to assertion of the temperature-detection-error signal.

7. The memory device of claim 5, wherein the temperature sensor is configured to assert a first temperature detection signal responsive to the temperature of the memory device exceeding a first temperature and to assert a second temperature detection signal responsive to the temperature of the memory device exceeding a second temperature greater than the first temperature, and wherein the temperature-detection-error sensing circuit is configured to generate the temperature-detection-error signal responsive to the first and second temperature detection signals.

8. The memory device of claim 7, wherein the temperature-detection-error sensing circuit configured to assert the temperature-detection-error signal responsive to a reversal phenomenon of the first and second temperature detection signals.

9. The memory device of claim 7, wherein the temperature-detection-error sensing circuit is configured to assert the temperature-detection-error signal responsive to a combination of the first and second temperature detection signals corresponding to erroneous operation of the temperature sensor.

10. The memory device of claim 5, wherein the temperature sensor control circuit includes a switching element configured to interrupt the temperature detection signal responsive to assertion of the temperature-detection-error signal.

11. The memory device of claim 10, wherein the temperature sensor control circuit comprises a latch configured to latch an input to a control electrode of the switching element responsive to assertion of the temperature-detection-error signal.

12. A method of operating a memory device, the method comprising:

generating a temperature detection signal responsive to a temperature of the memory device, wherein generating a temperature detection signal responsive to a temperature of the memory device comprises:

asserting a first temperature detection signal responsive to the temperature of the memory device exceeding a first temperature; and asserting a second temperature detection signal responsive to the temperature of the memory device exceeding a second temperature greater than the first temperature;

controlling a refresh of the memory device responsive to the temperature detection signal; and asserting a temperature-detection-error signal responsive to an error of the temperature detection signal, wherein asserting a temperature-detection-error signal responsive to an error of the temperature detection signal comprises generating the temperature-detection-error signal responsive to the first and second temperature detection signals.

13. The method of claim 12, further comprising providing the asserted temperature-detection-error signal to a recipient external to the memory device.

14. The method of claim 12, wherein asserting a temperature-detection-error signal responsive to an error of the temperature detection signal comprises asserting the temperature-detection-error signal responsive to a reversal phenomenon of the first and second temperature detection signals.

15. A method of operating a memory device, the method comprising:

generating a temperature detection signal responsive to a temperature of the memory device; wherein generating a temperature detection signal responsive to a temperature of the memory device comprises: asserting a first temperature detection signal responsive to the temperature of the memory device exceeding a first temperature; and asserting a second temperature detection signal responsive to the temperature of the memory device exceeding a second temperature greater than the first temperature; and controlling a refresh of the memory device responsive to the temperature detection signal;

asserting a temperature-detection-error signal responsive to an error of the temperature detection signal; wherein asserting a temperature-detection-error signal responsive to an error of the temperature detection signal comprises generating the temperature-detection-error signal responsive to the first and second temperature detection signals; and electronically controlling the temperature detection signal responsive to the temperature-detection-error signal.

16. The method of claim 15, wherein asserting a temperature-detection-error signal responsive to an error of the temperature detection signal comprises asserting the temperature-error-detection signal responsive to a reversal phenomenon of the first and second temperature detection signals.

17. A method of testing a temperature sensor used to control refresh in a memory device, the method comprising:

changing a temperature of the memory device to a predetermined temperature;

generating a temperature detection signal responsive to the predetermined temperature;

asserting a temperature-detection-error signal responsive to an error of the temperature detection signal;

providing the asserted temperature-detection-error signal to an external recipient via a temperature-detection-error sensing pad of the memory device; and identifying the memory device as defective responsive to the temperature-detection-error signal at the temperature-detection-error sensing pad.

18. The method of claim 17:

wherein generating a temperature detection signal responsive to the predetermined temperature comprises:

asserting a first temperature detection signal responsive to the temperature of the memory device exceeding a first temperature; and asserting a second temperature detection signal responsive to the temperature of the memory device exceeding a second temperature greater than the first temperature; and wherein asserting a temperature-detection-error signal responsive to an error of the temperature detecting signal comprises generating the temperature-detection-error signal responsive to the first and second temperature detection signals.

19. The method of claim 18, wherein asserting a temperature-detection-error signal responsive to an error of the temperature detecting signal comprises asserting the temperature-detection-error signal responsive to a reversal phenomenon of the first and second temperature detection signals.

20. A method of testing a temperature sensor used to control refresh in a memory device, the method comprising:

changing a temperature of the memory device to a predetermined temperature;

generating a temperature detection signal responsive to the predetermined temperature;

asserting a temperature-detection-error signal responsive to an error of the temperature detection signal;

controlling the temperature detection signal responsive to the temperature-detection-error signal; and identifying the memory device as defective responsive to the temperature detection signal.

21. The method of claim 20:

wherein generating a temperature detection signal responsive to the predetermined temperature comprises:

asserting a first temperature detection signal responsive to the temperature of the memory device exceeding a first temperature; and asserting a second temperature detection signal responsive to the temperature of the memory device exceeding a second temperature greater than the first temperature; and wherein asserting a temperature-detection-error signal responsive to an error of the temperature detection signal comprises generating the temperature-detection-error signal responsive to the first and second temperature detection signals.

22. The method of claim 21, wherein asserting a temperature-detection-error signal responsive to an error of the temperature detection signal comprises asserting the temperature-detection-error signal responsive to a reversal phenomenon of the first and second temperature detection signals.

23. The method of claim 20:

wherein controlling the temperature detection signal responsive to the temperature-detection-error signal comprises fixing the temperature detection signal responsive to assertion of the temperature-detection-error signal; and wherein identifying the memory device as defective responsive to the temperature detection signal comprises identifying the memory device as defective responsive to a self refresh current of the memory device remaining substantially unchanged when a temperature of the memory device changes.

* * * * *